US009960188B2

(12) United States Patent
Zhang (10) Patent No.: US 9,960,188 B2
(45) Date of Patent: May 1, 2018

(54) THIN FILM TRANSISTOR, ARRAY SUBSTRATE, AND FABRICATION METHOD THERE OF, AND DISPLAY APPARATUS

(71) Applicant: BOE TECHNOLOGY GROUP CO., LTD, Beijing (CN)

(72) Inventor: Li Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 15/038,227

(22) PCT Filed: Dec. 10, 2015

(86) PCT No.: PCT/CN2015/096927
§ 371 (c)(1),
(2) Date: May 20, 2016

(87) PCT Pub. No.: WO2016/145914
PCT Pub. Date: Sep. 22, 2016

(65) Prior Publication Data
US 2017/0117302 A1   Apr. 27, 2017

(30) Foreign Application Priority Data
Mar. 18, 2015   (CN) .......................... 2015 1 0119417

(51) Int. Cl.
*H01L 27/12* (2006.01)
*H01L 29/786* (2006.01)
(Continued)

(52) U.S. Cl.
CPC ........ *H01L 27/1225* (2013.01); *H01L 27/124* (2013.01); *H01L 29/4908* (2013.01);
(Continued)

(58) Field of Classification Search
CPC ............... H01L 27/1225; H01L 27/124; H01L 29/4908; H01L 29/66742; H01L 29/66969; H01L 29/78642
(Continued)

(56) References Cited

U.S. PATENT DOCUMENTS 6,107,660 A * 8/2000 Yang ................. H01L 29/66666
257/329
2006/0175609 A1   8/2006 Chan
(Continued)

FOREIGN PATENT DOCUMENTS

CN   101546077 A * 9/2009 ........... H01L 27/124
CN   103022150 A   4/2013
(Continued)

OTHER PUBLICATIONS

Yabuta, Hisato, et al. "High-mobility thin-film transistor with amorphous InGaZnO4 channel fabricated by room temperature rf-magnetron sputtering." Applied physics letters 89.11 (2006): 112123.*
(Continued)

*Primary Examiner* — Fernando L Toledo
*Assistant Examiner* — Adam S Bowen
(74) *Attorney, Agent, or Firm* — Anova Law Group, PLLC (57) ABSTRACT

A thin film transistor comprises a source over a substrate; a first insulation layer having a source contact through-hole corresponding to a position of the source over the source; an active layer electrically connecting with the source through the source contact through-hole over the etching stop layer; a second insulation layer having a drain contact through-hole exposing a portion of the active layer over the active layer; and a drain electrically connecting with the active layer through the drain contact through-hole over the second insulation layer.

20 Claims, 5 Drawing Sheets

(51) Int. Cl.
    *H01L 29/49*  (2006.01)
    *H01L 29/66*  (2006.01)
(52) U.S. Cl.
    CPC .. *H01L 29/66742* (2013.01); *H01L 29/66969*
    (2013.01); *H01L 29/78642* (2013.01)
(58) Field of Classification Search
    USPC .......................................................... 257/43
    See application file for complete search history.

(56) References Cited

U.S. PATENT DOCUMENTS

| | | | | |
|---|---|---|---|---|
| 2013/0001573 | A1* | 1/2013 | Lee | H01L 29/45 |
| | | | | 257/60 |
| 2014/0151720 | A1 | 6/2014 | Lan et al. | |
| 2015/0325706 | A1* | 11/2015 | Liu | H01L 29/66969 |
| | | | | 257/43 |

FOREIGN PATENT DOCUMENTS

| | | |
|---|---|---|
| CN | 103311310 A | 9/2013 |
| CN | 103413834 A | 11/2013 |
| CN | 104218091 A | 12/2014 |
| CN | 104681629 A | 6/2015 |
| JP | 2004048036 A | 2/2004 |
| JP | 2005167164 A | 6/2005 |

OTHER PUBLICATIONS

State Intellectual Property Office of the P.R.C (SIPO) Office Action 1 for 201510119417.4 dated Feb. 28, 2017 11 Pages.

* cited by examiner

THIN FILM TRANSISTOR, ARRAY SUBSTRATE, AND FABRICATION METHOD THERE OF, AND DISPLAY APPARATUS

CROSS-REFERENCES TO RELATED APPLICATIONS

This application is a national phase entry under 35 U.S.C. § 371 of International Application No. PCT/CN2015/096927, filed on Dec. 10, 2015, which claims priority to Chinese Patent Application No. 201510119417.4, filed on Mar. 18, 2015. The above enumerated patent applications are incorporated by reference herein in their entirety.

FIELD OF THE INVENTION

The present invention generally relates to the field of the display technologies and, more particularly, to a thin film transistor and fabrication processes thereof, an array substrate and fabrication processes thereof, and a display apparatus.

BACKGROUND

Currently, the commonly used display apparatus includes Liquid Crystal Display (LCD) display apparatus and Organic Light-Emitting Diode (OLED) display apparatus. Both LCD display apparatus and OLED display apparatus include array substrates. The array substrate includes a plurality of Thin Film Transistors (TFTs)

With the continuous innovation of the semiconductor design and manufacturing technologies, the continuous improvement of device speed and continuous increase of size and resolution of the display panel, the occupy area of the TFTs has become more important than ever, especially in oxide TFTs.

An oxide TFT usually includes a gate formed over a substrate, a gate dielectric layer covering the gate, an active layer formed over the gate dielectric layer, an etching stop layer formed over the active layer, a source contact through-hole and a drain contact through-holes respectively penetrating through the gate dielectric layer; and a source and a drain connecting with the active layer. The channel of the TFT in the active layer in such a TFT is referred as a lateral channel.

The source contact through-hole and the drain contact through-holes are formed in a same layer. Thus, the source contact through-hole and the drain contact through-hole have to have a required distance because of the limitation of the etching process for forming the source contact through-hole and the drain contact through-hole. The required distance can prevent the source contact through-hole and the drain contact through-hole from being penetrated through during the etching process. If the source contact through-hole and the drain contact through-hole are penetrated through during the etching process, the TFT would fail.

The required distance between the source contact through-hole and the drain contact through-hole is referred as the width of the channel of the TFT in the active layer. Further, the required distance is also related to the size of the TFT. Thus, the size of the oxide TFT is relatively large because of the required distance.

Further, because the gate is formed in a different layer from the source and the drain, a parasitic capacitance may be generated between the gate and the source and between the gate and drain. Thus, the display effect of a display apparatus having such oxide TFTs may not meet the desired requirements. The disclosed device structures, methods and systems are directed to at least partially solve one or more problems set forth above and other problems.

BRIEF SUMMARY OF THE DISCLOSURE

One aspect of the present disclosure includes providing a thin film transistor. The thin film transistor comprises a source over a substrate; a first insulation layer having a source contact through-hole corresponding to a position of the source over the source; an active layer electrically connecting with the source contact through-hole over the first insulation layer; a second insulation layer having a drain contact through-hole exposing a portion of the active layer over the active layer; and a drain electrically connecting with the active layer through the drain contact through-hole over the second insulation layer.

Optionally, the thin film transistor further includes a gate in a same layer with the drain, wherein an orthographic projection of the gate on the substrate at least partially overlap with an orthographic projection of the source on the substrate.

Optionally, the thin film transistor further includes a gate in a same layer with the source, wherein an orthographic projection of the gate on the substrate at least partially overlap with an orthographic of the drain on the substrate a gate in a same layer with one of the source and the drain.

Optionally, the active layer is made of one or more of oxide, nitride, sulphide, oxynitride, sulphinitride which includes at least one element from indium, gallium, zinc, aluminum, and tin.

Optionally, the gate, the source and the drain are made of at least one of Mo, MoNb alloy, Al, AlNd alloy, Ti and Cu.

Optionally, the source includes a ring-shaped source body and a source extension connecting with the ring-shaped source body; the source contact through-hole in the first insulation layer is a ring-shaped opening, the ring-shaped opening is over the ring-shaped source body; the active layer covers the first insulation layer over the ring-shaped source body; the second insulation layer is over the active layer, the drain contact through-hole in the second insulation layer is a ring-shaped opening; the source includes a source body and a source extension connecting with the source body, the source body covers the source contact through-hole; and the gate includes an open-loop gate body and a gate extension connecting with the open-loop gate body, the open-loop gate body surrounds the source body, the open position of the open-loop gate body is corresponding to the position of the source extension.

Another aspect of the present disclosure includes providing a method for fabricating a thin film transistor. The method comprises forming a source on a substrate; forming a first insulation layer having a source contact through-hole exposing a portion of the source over the substrate; forming an active layer electrically connecting with the source through the source contact through-hole over the first insulation layer; forming a second insulation layer having a drain contact through-hole exposing a portion of the active layer over the active layer and the first insulation layer; and forming a source electrically connecting with the active layer.

Optionally, the method further including forming a gate in the same layer with the source.

Optionally, the method further includes forming a gate in the same layer with the drain.

Optionally, the method further includes forming a first metal layer over the substrate; and patterning the first metal layer to form the source.

Optionally, the first metal layer is formed by one of a sputtering process, a thermal evaporation process, a plasma-enhanced chemical vapor deposition process, an atmospheric chemical vapor deposition process, and an electron cyclotron resonance chemical vapor deposition process; and the first metal layer is a multiple-layer structure made of two or more of Mo, MoNb, Al, AlNd, Ti and Cu.

Optionally, the active layer is formed by a magneto sputtering process; and the active layer is made of one of InGaZnO, InSnO, InGaSnO; and doped poly silicon.

Another aspect of the present disclosure includes providing an array substrate comprising at least one disclosed thin film transistor.

Optionally, the array substrate further includes a passive layer over the drain of the thin film transistor, the gate of the thin film transistor and the second insulation layer; and a pixel electrode electrically connecting with the drain of the thin film transistor through a pixel contact through-hole in the passive layer over the passive layer.

Optionally, the array substrate further includes an auxiliary electrode electrically connecting with the gate of the thin film transistor through a gate contact through-hole in the passive layer; and the pixel electrode and the auxiliary electrode are formed in a same layer.

Optionally, the orthographic projection of the gate contact through-hole on the substrate and the orthographic projection of the source contact through-hole on the substrate partially overlap.

Optionally, the passive layer is a multiple-layer structure made of two or more of $SiO_x$, $SiN_x$, $HfO_x$, SiON and $AlO_x$; and the pixel electrode is a multiple-layer structure including a ITO/Ag/ITO structure, an Ag/ITO structure, an IZO/Ag/IZO structure, an Ag/IZO structure, an IGZO/Ag/IGZO structure, an InGaSnO/Ag/InGaSnO structure, an Ag/InGaSnO structure, or a structure made of one of ITO, ZnO, PEDOT:PSS, PANI, Cu, Au, Ag, and Pt.

Another aspect of the present disclosure includes providing a method for fabricating an array substrate. The method comprises the disclosed method for fabricating a thin film transistor Optionally, the method further includes forming a passive layer having a pixel electrode contact through-hole exposing the drain of the thin film transistor over the drain of the thin film transistor and the second insulation layer; and forming a pixel electrode electrically connecting with the drain of the thin film transistor through the pixel electrode contact through-hole over the passive layer.

Optionally, the method further includes forming a gate contact through-hole exposing the gate of the thin film transistor over the drain of the thin-film transistor, the gate of the thin film transistor and the passive layer when the pixel electrode is being formed; and forming an auxiliary electrode electrically connecting with the gate through the gate contact through-hole when the pixel electrode is being formed.

Optionally, the orthographic projection of the gate contact through-hole on the substrate and the orthographic projection of the source contact through-hole on the substrate entirely overlap.

Another aspect of the present disclosure includes providing a display apparatus. The display apparatus comprises at least the disclosed array substrate.

According to the disclosed embodiments, the source and the drain of a thin film transistor are formed in different layers; and the active layer is formed between the layer having the source and the layer having the drain. Thus, a vertical channel may be formed. Comparing a lateral channel, the channel length in the active layer may be significantly reduced. Thus, the occupy area of the thin film transistor is reduced. Therefore, a display apparatus having such thin film transistors may achieve a relatively high definition and a relatively large aperture ratio. At the same time, the gate and one of the source and drain may be formed in a same layer. Thus, the parasitic capacitance between the drain and the gate, or the parasitic capacitance between the gate and the source may be avoided. Thus, the switching performance of the thin film transistor may be improved. Further, because the source contact through-hole and drain contact through-hole may be formed in the different layers, the source contact through-hole and the drain contact through-hole may not be penetrated through during the etching processes for forming the source contact through-hole and the drain contact through-hole Other aspects of the present disclosure can be understood by those skilled in the art in light of the description, the claims, and the drawings of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1A:
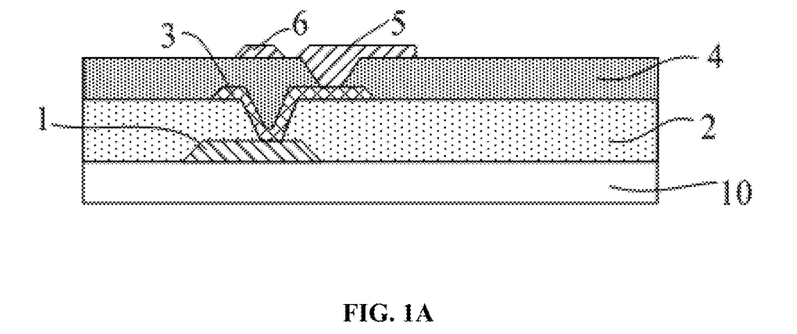
FIG. 1A illustrates an exemplary thin film transistor according to disclosed embodiments.

According to the disclosed embodiments, a thin film transistor (TFT) is provided. The TFT may be a top-gated TFT or a bottom-gated TFT. FIG. 1A illustrates an exemplary top-gated TFT according to the disclosed embodiments.

As shown in FIG. 1, the TFT may include a source 1A formed over a substrate 10. The TFT may also include a first insulation layer 2 formed over the source 1. A source contact through-hole (not labeled) may be formed in the first insulation layer 2 at a position corresponding to the source 1. That is, the source contact through-hole may expose the source 1.

Further, the TFT may also include an active layer 3 formed over the first insulation layer 2. The active layer 3 may be electrically connected with the source 1 through the source contact through-hole.

Further, the TFT may also include a second insulation layer 4 formed over the active layer 3. A drain contact through-hole (not labeled) may be formed in the second insulation 4 at a position corresponding to the active layer 3. That is, the drain contact through-hole may expose a portion of the active layer 3 on the first insulation layer 2.

Further, the TFT may also include a drain 5 and a gate 6. The drain 5 and the gate 6 may be formed in a same layer; and may be formed over the second insulation layer 4. Further, the drain 5 may be electrically connected with the active layer 3 through the drain contact through-hole. Further, the orthographic projection of the gate 6 on the substrate 10 and the orthographic projection of the active layer 3 on the substrate 10 may partially overlap.

Referring to FIG. 1A, in the present TFT, the source 1 and the drain 5 are formed in different layers; and the active layer 3 is formed between the layer having the source 1 and the layer having the drain 5. Further, the channel of the TFT in the active layer 3 is formed on the side surface of the source contact through-hole near to the drain contact through-hole. Thus, comparing the lateral channel of existing TFT, the present TFT has a vertical channel; and the lateral width of the channel in the active layer 3 may be significantly reduced. Therefore, the occupying area of the TFT may be reduced; and the display panel having such TFTs may have a higher pixel density, i.e., pixels per inch (PPI), or definition, and larger aperture ratio.

Further, the source contact through-hole and the drain contact through-hole may be in different layers. Thus, the source contact through-hole and the drain contact through hole may be not penetrated through during the etching processes for forming the source contact through-hole and the drain contact through-hole. Further, because the gate 6 and the drain 5 of the TFT are formed in a same layer, the parasitic capacitance between the gate 6 and the drain 5 may be avoided. Therefore, the switching performance of the TFT may be improved.

Figure 1B:
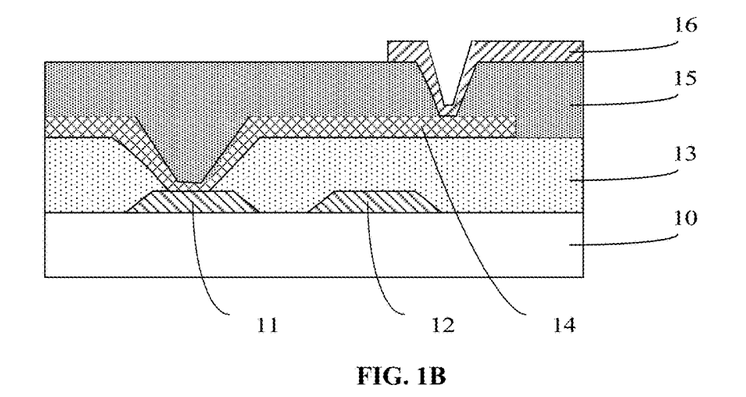
FIG. 1B illustrates another exemplary thin film transistor according to the disclosed embodiments.

FIG. 1B illustrates another TFT according to the disclosed embodiments. As shown in FIG. 2, the TFT may include a source 11 formed over a substrate 10, and a gate 12 formed over the substrate 10. The TFT may also include a first insulation layer 13 formed over the source 11 and the gate 12. The first insulation layer 13 may also be used as a gate insulation layer. A source contact through-hole (not labeled) may be formed in the first insulation layer 13 at a position corresponding to the source 11. That is, the source contact through-hole may expose the source 11.

Further, the TFT may also include an active layer 14 formed over the first insulation layer 13 and the in the source contact through-hole. The active layer 14 may be electrically connected with the source 11 through the source contact through-hole.

Further, the TFT may also include a second insulation layer 15 formed over the active layer 14. A drain contact through-hole (not labeled) may be formed in the second insulation 15 at a position corresponding to the active layer 14. That is, the drain contact through-hole may expose a portion of the active layer 14 on the first insulation layer 13.

Further, the TFT may also include a drain 16. The drain 16 may be formed over the second insulation layer 15 and in the drain contact through-hole. Further, the drain 16 may be electrically connected with the active layer 14 through the drain contact through-hole.

Referring to FIG. 1B, in the present TFT, the source 11 and the drain 16 are formed in different layers. That is, the source contact through-hole and the drain contact through-hole may be in different layers. Thus, the source contact through-hole and the drain contact through-hole may not be penetrated through during the etching process for forming the source contact through-hole and the drain contact through-hole.

Figure 2:
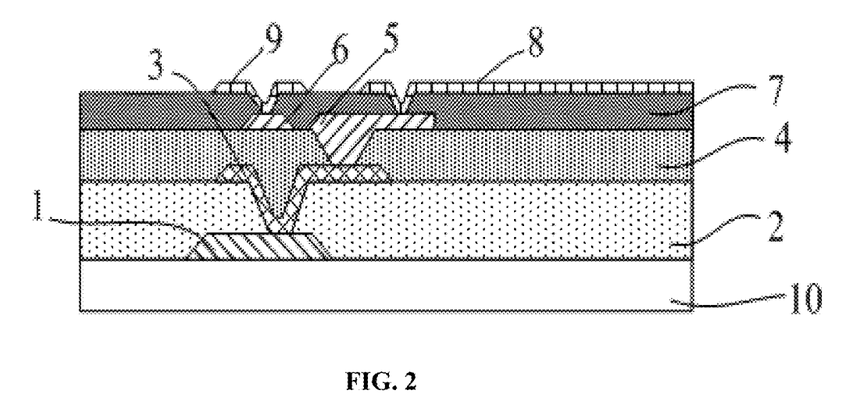
FIG. 2 illustrates an exemplary array substrate according to disclosed embodiments.

According to the disclosed embodiments, an array substrate is provided. FIG. 2 illustrates an exemplary array substrate. The array substrate may include at least one disclosed TFT.

As shown in FIG. 1B, the array substrate may include the TFT illustrated in FIG. 1A. Further, the array substrate may also include a passive layer 7 formed over the gate 6 and the source 5; and a pixel electrode 8 formed over the passive layer 7. A pixel electrode contact through-hole (not labeled) may be formed in the passive layer 7; and the pixel electrode 8 may be electrically connected with the drain 5 of the TFT through the pixel electrode contact through-hole.

When the array substrate is used in an LCD display panel, the pixel electrode 8 may be use to drive the molecules of liquid crystal to rotate. When the array substrate is used in an OLED display panel, the pixel electrode 8 may be the bottom electrode of an OLED; and may be used to create an electrical potential with the top electrode of the OLED. The electrical potential may cause the light-emitting layer of the OLED to emit light. The OLED display panel may be top-gated, or bottom-gated. For example, when the bottom electrode of the OLED is an anode, the top electrode may be a cathode. If the bottom electrode of the OLED is a cathode, the top electrode may be an anode.

Further, as shown in FIG. 2, the array substrate may also include an auxiliary electrode 9 formed in a same layer with the pixel electrode 8. A gate contact through-hole (not labeled) may be formed in the passive layer 7; and the gate contact through-hole may expose the gate 6. The auxiliary electrode 9 and the gate 6 of the TFT may be electrically connected through the gate contact through-hole.

Further, the orthographic projection of the gate contact through-hole on the substrate 10 and the orthographic projection of the source contact through-hole on the substrate 10 may entirely overlap. Thus, the auxiliary electrode 9 may entirely cover the channel in the active layer 3. Further, because the gate 6 and the auxiliary electrode 9 may be electrically connected. Thus, the facing area between the gate 6 and the channel in the active layer 3 may be increased; and the switching performance of the TFT may be significantly improved.

The array substrate having the disclosed TFTs may achieve a higher PPI and large aperture ratio. Further, because the parasitic capacitance between the gate 6 and the drain 5 may be reduced, the power consumption of the array substrate may be reduced. Further, because the source contact through-hole exposing the source 1 and the drain contact through-hole exposing the active layer 3 may be not be penetrated through during the fabrication processes of the source contact through-hole and the drain contact through-hole, the yield of the array substrate may be improved.

Figure 6:
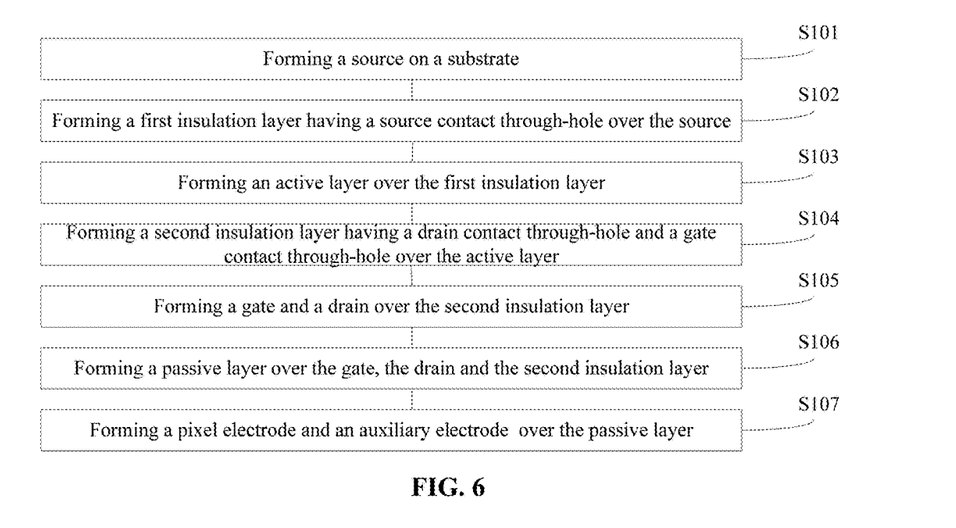
FIG. 6 illustrates an exemplary fabrication process of an array substrate according to the disclosed embodiments.

Further, according to the disclosed embodiments, a method for fabricating an array substrate having a disclosed TFT is provided. FIG. 6 illustrates an exemplary fabrication process of an array substrate having at least one disclosed TFT according to the disclosed embodiments; and FIGS. 3a-3g illustrate structures corresponding to certain stages of the exemplary fabrication process.

Figure 3:
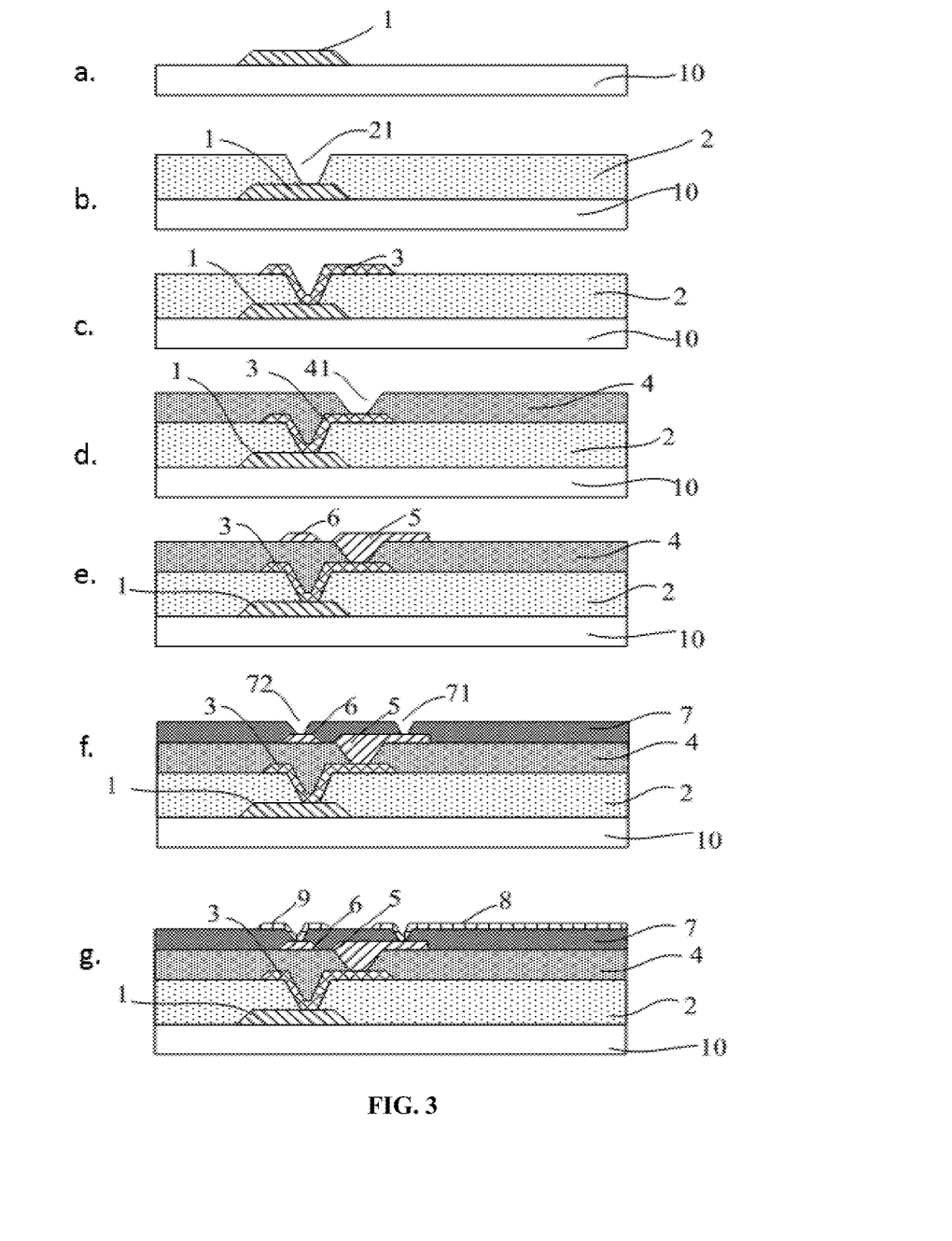
FIGS. 3a-3g illustrate structures corresponding to certain stages of an exemplary fabrication process of an array substrate having a thin film transistor according to the disclosed embodiments.

As shown in FIG. 6, at the beginning of the fabrication process, a substrate is provided; and a source of the TFT is formed (S101). FIG. 3a illustrates a corresponding structure.

As shown in FIG. 3a, a substrate 10 is provided; and a source 1 of the TFT is formed on one surface of the substrate 10. The substrate 10 provides a base for subsequent processes and devices.

The substrate 10 may be made of any appropriate transparent material, such as glass, epoxy, quartz, or sapphire, etc. The substrate 10 may be cleaned by any appropriate processes.

The source 1 of the TFT may be formed by depositing a first metal layer on the pre-cleaned substrate 10; and followed by patterning the first metal layer.

The first metal layer may be made of any appropriate material, such as one or more of Mo, MoNb, Al, AlNd, Ti, and Cu, etc. The first metal layer may be a single layer structure, or a multiple-layer structure. In one embodiment, the first metal layer is made one of Mo and Al, or an alloy containing Mo, or Al.

Various processes may be used to form the first metal layer, such as a sputtering process, a thermal evaporation process, a plasma-enhanced chemical vapor deposition (PECVD) process, a low pressure chemical vapor deposition (LPCVD) process, an atmospheric pressure chemical vapor deposition (APCVD) process, or an electron cyclotron resonance chemical vapor deposition (ECR-CVD) process, etc. The patterning process may include spin-coating a photoresist layer, exposing the photoresist layer, developing the exposed photoresist layer, etching the first metal layer using the exposed photoresist layer as an etching mask, and striping the developed photoresist layer, etc. Thus, the source 1 with designed pattern may be formed.

In certain other embodiments, a gate may be formed on the substrate 10 if the method is used for forming the TFT illustrated in FIG. 1B. The gate may be formed with the source 1 simultaneously, and the gate and the source 1 may be formed by patterning a same metal material layer.

Returning to FIG. 6, after forming the source 1, a first insulation layer having a source contact through-hole may be formed (S102). FIG. 3b illustrates a corresponding structure.

As shown in FIG. 3b, a first insulation layer 2 is formed over the substrate 10; and a source contact through-hole 21 is formed in the first insulation layer 2. The source contact through-hole 21 may be over the source 1; and the source 1 may be exposed by the contact through-hole 21.

The first insulation layer 2 may be made of any appropriate material, such as one or more of $SiO_x$, $SiN_x$, $HfO_x$, SiON, and $AlO_x$, etc. The first insulation layer 2 may be a single layer structure, or a multiple-layer structure. Various processes may be used to form the first insulation layer 2, such as a thermal growth process, an APCVD process, a LPCVD process, a PECVD process, or a sputtering process, etc.

The source contact through-hole 21 may be formed by any appropriate process, such as a standard photolithography process, or an ion beam etching process. The standard photolithography process may include spin-coating a photoresist layer, exposing the photoresist layer, developing the exposed photoresist layer, etching the first insulation layer 2, and striping the developed photoresist layer, etc. Thus, the source contact through-hole 21 penetrating through the first insulation layer 2 and exposing the source 1 may be formed.

Returning to FIG. 6, after forming the first insulation layer 2, an active layer may be formed (S103). FIG. 3c illustrates a corresponding structure.

As shown in FIG. 3c, an active layer 3 formed on the source 1, the side surfaces of the source contact through-hole 21 and the first insulation layer 2. That is, the active layer 3 may be electrically connected with the source 1.

The active layer 3 may be formed by forming a semiconductor material layer; and followed by patterning the semiconductor material layer. The semiconductor material layer may be made of any appropriate semiconductor material, such as one or more of oxide, sulfide, oxynitride, and oxysulfide, etc. The oxide, the sulfide, the oxynitride, and the oxysulfide may include at least one or more of indium, gallium, zinc, aluminum, and tin, etc. For example, the active layer 3 may be made of $ZnGaO_x$, $InZnO_x$, $InSnO_x$, or $InGaSnO_x$, etc.

Various processes may be used to form the semiconductor material layer, such as a PECVD process, an LPCVD process, or a sputtering process, etc. In one embodiment, the semiconductor material layer is formed by a magnetron sputtering process.

The semiconductor material layer may be patterned by any appropriate process, such as a dry etching process, a wet etching process, and an ion beam etching process. A standard photolithography process may also be used to pattern the semiconductor material layer to form the active layer 3.

In one embodiment, the active layer 3 is made of poly silicon. The poly silicon may be doped by ion implantation process to have conductive property.

Returning to FIG. 6, after forming the active layer 3, a second insulation layer having a drain contact through-hole may be formed (S104). FIG. 3d illustrates a corresponding structure.

As shown in FIG. 3d, a second insulation layer 4 is formed on the first insulation layer 2 and the active layer 3. Further, a drain contact through-hole 41 is formed in the second insulation layer 4 on the active layer 3. That is, the drain contact through-hole 41 may expose a portion of the active layer 3 on the first insulation layer 2.

The second insulation layer 4 may be made of any appropriate material, such as one or more of $SiO_x$, $SiN_x$, $HfO_x$, SiON, and $AlO_x$, etc. The second insulation layer 4 may be a single layer structure, or a multiple-layer structure. Various processes may be used to form the second insulation layer 4, such as a thermal growth process, an APCVD process, a PECVD process, or a sputtering process, etc.

The drain contact through-hole 41 may be formed by a standard photolithography process, or an ion beam etching process, etc. The standard photolithography process may include spin-coating a photoresist layer, exposing the photoresist layer, developing the exposed photoresist layer, etching the second insulation layer 4, and striping the photoresist. Thus, the drain contact through-hole 41 penetrating through the second insulation layer 4 and exposing the portion of the active layer 3 may be formed.

Returning to FIG. 6, after forming the second insulation layer 4 having the drain contact through-hole 41, a gate and a drain may be formed (S105). FIG. 3e illustrates a corresponding structure.

As shown in FIG. 3e, a drain 5 is formed on the portion of the active layer 3 exposed by the drain contact through-hole 41, in the drain contact through-hole 41 and on a portion of the second insulation layer 4. Further, a gate 6 is formed on a portion of the second insulation layer 4. The orthographic projection of the gate 6 on the substrate 10 and the orthographic projection of the channel region of the TFT in the active layer 3 on the substrate 10 may partially overlap. Further, the source 5 may be electrically connected with the active layer 3 through the source contact through-hole 41. Thus, a TFT is obtained.

The gate 6 and the drain 5 may be formed by forming a second metal layer on the second insulation layer 4 and in the drain contact through-hole 41; and followed by patterning the second metal layer. The second metal layer may be made of any appropriate material, such as one or more of Mo, MnNb alloy, Al, AlNd alloy, Ti, and Cu, etc. In one embodiment, the second metal layer is made of one or more of Mo and Al, or an alloy containing Al, or Mo. The second metal layer may be a single layer structure, or a multiple-layer structure. Various processes may be used to form the second metal layer, such as a sputtering process, a thermal evaporation process, a PECVD process, an LPCVD process, an APCVD process, or an ECR-CVD process.

The second metal layer may be patterned by any appropriate process to form the drain 5 and the gate 6, such as a standard photolithography process, or an ion beam etching process, etc. The standard photolithography process may include spin-coating a photoresist layer, exposing the photoresist layer, developing the exposed photoresist layer, etching the second metal layer and striping the developed photoresist. Thus, the drain 5 and the gate 6 may be formed.

Thus, a TFT is formed. The TFT is identical to the TFT illustrated in FIG. 1A. Because the source contact through hole 21 and the drain contact through hole 41 may be formed in the first insulation layer 2 and the second insulation layer 4, respectively, the source contact through-hole 21 and the drain contact through-hole 41 may be not be penetrated through during the etching processes. After forming the TFT, a passive layer and a pixel electrode may be formed; and an array substrate may be formed.

Returning to FIG. 6, after forming the drain 5 and the gate 6, a passive layer having a pixel electrode contact through-hole and a gate contact through-hole may be formed (S106). FIG. 3f illustrates a corresponding structure.

As shown in FIG. 3f, a passive layer 7 is formed over the second insulation layer 4, the drain 5 and the gate 6. Further, a pixel electrode contact through-hole 71 may be formed in the passive layer 7 on the drain 5. That is, a portion of the drain 5 on the second insulation layer 4 may be exposed by the pixel electrode contact through-hole 71. Further, a gate contact through-hole 72 may be formed on the in the passive layer 7 on the gate 6. That is, the gate 6 may be exposed by the gate contact through-hole 72.

The passive layer 7 having the pixel electrode contact through-hole 71 and the gate contact through-hole 72 may be formed by forming a passive material layer; and followed by patterning the passive material layer to form the pixel electrode contact through-hole 71 and the gate contact through-hole 72.

The passive material layer may be made of any appropriate material, such as one of more of $SiO_x$, $SiN_x$, $HfO_x$, SiON, and $AlO_x$, etc. The passive layer 7 may be a single layer structure, or a multiple-layer structure. Various processes may be used to form the passive material layer, such as a thermal growth process, an APCVD process, an LPCVD process, a PECVD process, and a sputtering process, etc.

The passive material layer may be patterned by any appropriate process to form the pixel electrode contact through-hole 71 and the gate contact through-hole 72, such as a standard photolithography process, or an ion beam etching process, etc. The standard photolithography process may include spin-coating a photoresist layer, exposing the photoresist layer, developing the exposed photoresist layer, etching the passive material layer, and striping the developed photoresist layer. Thus, the pixel electrode contact through-hole 71 penetrating through the passive layer 7 and exposing a portion of the drain 5 on the first insulating layer 4 and the gate contact through-hole penetrating through the passive layer 7 and exposing the gate 6 may be formed.

Returning to FIG. 6, after forming the passive layer 7, a pixel electrode and an auxiliary electrode may be formed (S107). FIG. 3g illustrates a corresponding structure.

As shown in FIG. 3g, a pixel electrode 8 is formed on a portion of the passive layer 7, on the exposed portion of the drain 5; and in the pixel electrode contact through-hole 71. That is, the pixel electrode 8 may be electrically connected with the drain 5 through the pixel electrode contact through-hole 71. Further, an auxiliary electrode 9 is formed on a portion of the passive layer 7, on the exposed portion of the gate 6, and in the gate contact through-hole 72. That is, the auxiliary electrode 9 may be electrically connected with the gate 6 through the gate contact through-hole 72. The auxiliary electrode 9 and the pixel electrode 8 are separated.

The pixel electrode 8 and the auxiliary electrode 9 may be formed by forming a conductive film on the passive layer 7, in the pixel electrode contact through-hole 71 and the gate contact through-hole 72; and followed by patterning the conductive film.

The conductive film may have a relatively high reflectivity and may match certain requirements for work function. Further, the conductive film may be double layer structure, or a triple layer structure. For example, an ITO/Ag/ITO structure, or an Ag/ITO structure. In certain other embodiments, the ITO in the double layer structure or triple layer structure may be substituted with IZO, IGZO, or InGaSnO, etc. The conductive film may also be made of inorganic metal oxide, organic conductive polymer, or metal material, etc., which has a relatively high conductivity, and large work function. The metal oxide may include ITO, or ZnO, etc. The organic conductive polymer may include PEDOT:SS, or PANI, etc. The metal material may include Au, Cu, Ag, or Pt, etc.

The conducive film may be formed by any appropriate process, such as a sputtering process, a thermal evaporation process, a PECVD process, an LPCVD process, an APCVD process, or an ECR-CVD process, etc. Various processes may be used to pattern the conductive film, such as a standard photolithography process, or an ion beam etching process, etc.

Thus, an array substrate may be formed. The array substrate may be similar with the array substrate illustrated in FIG. 2. After forming the array substrate, a pixel define layer (DFL) may be formed. Then, a light-emitting layer (EL) may be formed by a thermal evaporation process, or a spin-coating process. Then, a top electrode layer may be formed by a sputtering process, or a thermal evaporation process. After a subsequent packaging process, an array substrate having OLEDs may be formed.

Referring to FIG. 2 and FIG. 3g, the orthographic projection of the gate contact through-hole 72 on the substrate 10 and the orthographic projection of the source contact through-hole 21 on the substrate 10 may entirely overlap. Thus, the auxiliary electrode 9 may entirely cover the channel in the active layer 3. Further, the gate 6 and the auxiliary electrode 9 may be electrically connected. Thus, the mutual-facing area between the gate 6 and the channel in the active layer 3 may be actually increased. Therefore, the switching performance of the TFT may be significantly improved.

In one embodiment, as described above, the TFT and the array substrate may be top-gated. In certain other embodiments, the TFT may be bottom-gated, the corresponding TFT may refer to FIG. 1B. When the TFT is bottom-gated, as shown in FIG. 1B, the gate 12 and the source 11 may be formed in a same layer, other layers may be similar to those in FIG. 2. For a bottom-gated array substrate, the gate contact through-hole 72 and the auxiliary electrode 9 may be omitted; and other layers may be similar in FIG. 1B.

Further, according to the disclosed embodiments, another array substrate having a TFT and a fabrication method thereof are provided. FIGS. 4a~4g and FIG. 5a~5g illustrate structures corresponding to certain stages of a fabrication process of another array substrate having a TFT. Comparing with the array substrate illustrated in FIG. 1B, the difference may include the patterns of different layers. The top views of the patterns of the different layers of the array substrate are illustrated in FIGS. 4a~4g, and the cross-sectional views of structures for forming the array substrate are illustrated in FIGS. 5a~5g.

Specifically, as shown in FIG. 4a and FIG. 5a, the TFT may include a source 1 formed on the substrate 10. The source 1 may include a ring-shaped source body 11 and a source extension 12 connecting with the ring-shaped source body 11. The ring-shaped source body 11 may be a close-loop and hollow ring structure. The ring-shaped source body 11 may be any appropriate shape, such a circular ring, a square ring, or a rectangular ring, etc.

Further, as shown in FIG. 4b and FIG. 5b, the TFT may also include first insulation layer 2 covering the source 1. A source contact through-hole 21 may be formed in the first insulation layer 2. The source contact through-hole 21 may be a ring-shaped opening exposing a portion of the ring-shaped source body 11. The shape of the first insulation layer 2 may be corresponding to the source 1. That is, the first insulation layer 2 may be ring-shaped. The first insulation layer 2 may also be a complete layer; and the first insulation layer 2 may often formed as a complete layer.

Further, as shown in FIG. 4c and FIG. 5c, the TFT may also include an active layer 3 formed on the first insulation layer 2. The pattern of the active layer 3 may be corresponding to the ring-shaped source body 11. The active layer 3 may be a complete layer without other patterns. That is, the active layer 3 may not be a hollow structure, may cover the entire first insulation layer 2 over the ring-shaped source body 11.

Further, as shown in FIG. 4d and FIG. 5d, the TFT may also include a second insulation layer 4 formed over the active layer 3. The second insulation layer 4 may cover the active layer 3. A drain contact through-hole 41 may be formed in the second insulation layer 4; and the drain contact through-hole 41 may be a ring-shaped opening. The structure of the second insulation layer 4 may be corresponding to the active layer 3; and the drain contact through-hole 41 may expose a portion of the active layer 3 on the first insulation layer 2.

Further, as shown in FIG. 4e and FIG. 5e, the TFT may also include a drain 5 and a gate 6 formed over the second insulation 4. The drain 5 may include a drain body 51 and a drain extension 52. The drain body 51 may cover the drain contact through-hole 41; and may be electrically connected with the active layer 3 through the drain contact through-hole 41.

The gate 6 may have an open-loop gate body 61 and a gate extension 62 connecting with the open-loop gate body 61. The open-loop gate body 61 may surround the drain body 51; and the open position of the open-loop gate body 61 may be corresponding to the position of the drain extension 52.

Figure 4:
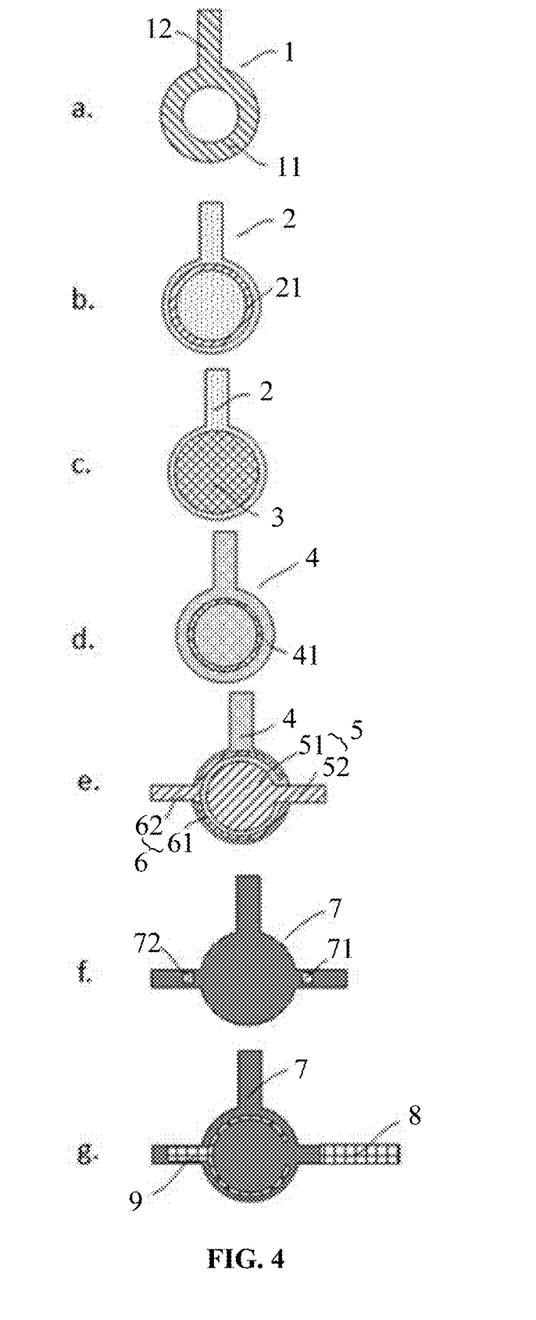
FIGS. 4a-4g illustrate a top view of different layers of another exemplary thin film transistor according to the disclosed embodiments.
Figure 5:
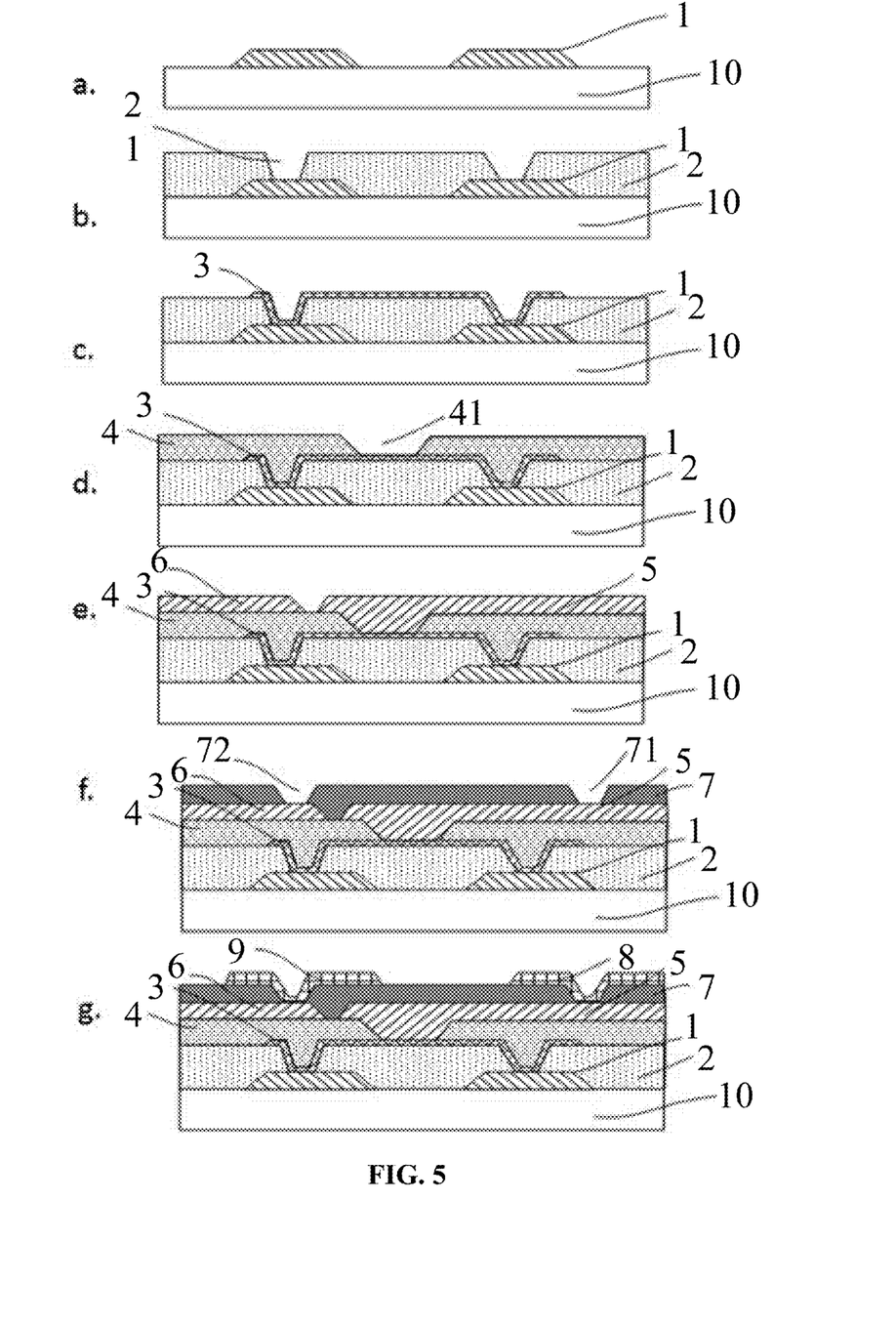
FIGS. 5a-5g illustrate structures corresponding to certain stages of an exemplary fabrication process of another array substrate having a thin film transistor according to the disclosed embodiments.

According to the descriptions and FIGS. 4~5, the layers of the TFT with different shapes are sequentially stacked to form the TFT. The source 1 and the drain 5 are formed in different layers; and the drain 5 and the gate 6 are formed in a same layer. Thus, the occupying area of the TFT may be reduced. Therefore, a display panel having such a TFT may have a relatively high definition (PPI) and a relatively large aperture ratio. Further, because the gate 6 of the TFT and the drain 5 may be formed in a same layer, the parasitic capacitance between the drain 5 and the gate 6 may be avoided. Thus, the switching performance of the TFT may be improved. Further, because the source contact through-hole 21 and the drain contact through-hole 41 may be formed in the different layers, i.e. the first insulation layer 2 and the second insulation layer 4, the source contact through-hole 21 and the second contact through-hole 41 may not be penetrated through during the etching process for forming the first contact through-hole 21 and the second contact through-hole 41. Thus, the yield of the TFT may be improved.

Further, according to the disclosed embodiments, another array substrate is provided. The array substrate may include at least the disclosed TFT illustrated in FIG. 4 and FIG. 5.

As shown in FIG. 4f and FIG. 5f, the array substrate may also include a passive layer 7 formed over the drain 5, the gate 6 and the second insulate layer 4. A pixel electrode contact through-hole 71 and a gate contact through-hole 72 may be formed in the passive layer 7. The pixel electrode contact through-hole 71 may expose a portion of the drain 5; and the gate contact through-hole 72 may expose a portion of the gate 6. Further, the passive layer 7 may include a circular passive layer body (not labeled) corresponding to the source body 51, and three extensions (not labels) corresponding to the extension (not labeled) of the first insulation layer 4, the source extension 52, and the gate extension 62, respectively. The gate contact through-hole 72 may be formed in the extension corresponding to the gate extension 62; and the pixel electrode contact through-hole 71 may be formed on in the extension corresponding to the drain extension 52.

Further, as shown in FIG. 4g and FIG. 5g, a pixel electrode 8 and an auxiliary electrode 9 may be formed on the passive layer 7. The pixel electrode 8 may be formed on the extension of the passive layer 7 having the pixel electrode contact through-hole 71. Thus, the pixel electrode 8 may be electrically connected with the drain 5.

The auxiliary electrode 9 may include an open-loop auxiliary electrode body (not labeled) formed on the passive layer body, and an auxiliary electrode extension formed on the extension of the passive layer 7 having the gate contact through-hole 72. Thus, the auxiliary electrode 9 may be electrically connected with the gate 6.

When such an array substrate is used as an OLED array substrate, the pixel electrode 8 may be used as a bottom electrode of an OLED device. When the TFT of the array substrate is used to drive the OLED device on the array substrate, the electric current may flow from the source 1 to the drain 5; and the electric current may drive the OLED device to emit light. That is, the electric current may flow from inside of the TFT to outside of the TFT. Thus, under a same driving voltage, the electric current of the TFT may be more stable.

Correspondingly, a method for fabricating the TFT is provided. The method may be similar to the method illustrated in FIG. 6. A major difference may be the patterns of different layers.

In the previous descriptions, the electrode connected with the pixel electrode 8 is referred as a drain 5, the other electrode is referred as a source 1. In certain other embodiments, the source and the drain are interchangeable. That is, the electrode connected with the pixel electrode 8 may be referred as a source.

Figure 7:
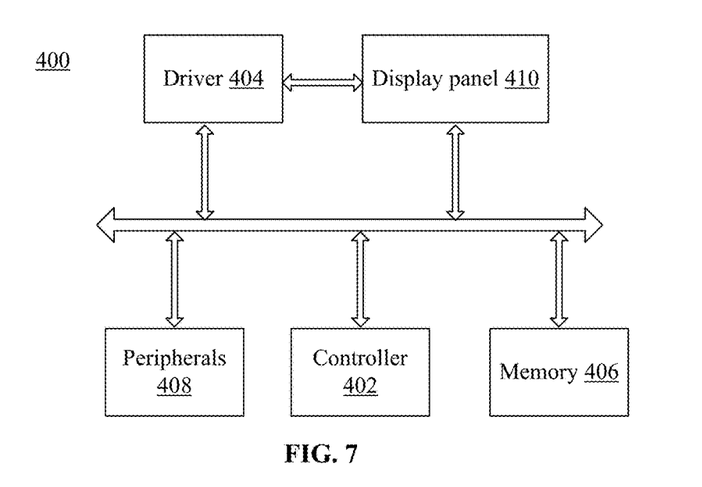
FIG. 7 illustrates a block diagram of an exemplary display apparatus according to the disclosed embodiments.

Further, according to the disclosed embodiments, a display apparatus is provided. FIG. 7 illustrates an exemplary display apparatus 400 incorporating at least a disclosed TFT or an array substrate and other aspects of the present disclosure. The display device 400 may be any appropriate device or component with certain display function, such as an OLED panel, an OLED TV, an OLED monitor, an OLED cell phone or an OLED navigation system, e-paper, etc. As shown in FIG. 7, the display apparatus 400 includes a controller 402, a driver circuit 404, a memory 406, peripherals 408, and a display panel 410. Certain devices may be omitted and other devices may be included.

The controller 402 may include any appropriate processor or processors. Further, the controller 402 can include multiple cores for multi-thread or parallel processing. The memory 406 may include any appropriate memory modules. The memory 406 may store computer programs for implementing various processes, when executed by the controller 402.

Peripherals 408 may include any interface devices for providing various signal interfaces. Further, peripherals 408 may include any input and output (I/O) devices. Peripherals 408 may also include any appropriate communication module for establishing connections through wired or wireless communication networks.

The driver circuitry 404 may include any appropriate driving circuits to drive the display panel 410. The display panel 410 may comprise at least a disclosed TFT or array substrate. During operation, the display panel 410 may be provided with image signals by the controller 402 and the driver circuit 404 for display. Because the disclosed TFTs and array substrate may have increased definitions and aperture ratio and improved switching performance, the performance of the display apparatus may also be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A thin film transistor, comprising:
a source over a substrate;
a first insulation layer having a source contact through-hole corresponding to the source over the source;
an active layer electrically connecting with the source through the source contact through-hole over the first insulation layer;
a second insulation layer having a drain contact through-hole exposing an upper surface of a portion of the active layer disposed outside the source contact through-hole; and
a drain electrically connecting with the active layer through the drain contact through-hole over the second insulation layer.

2. The thin film transistor according to claim 1, further including:
a gate in a same layer with the drain, wherein an orthographic projection of the gate on the substrate at least partially overlap with an orthographic projection of the source on the substrate.

3. The thin film transistor according to claim 1, further including:
a gate in a same layer with the source, wherein an orthographic projection of the gate on the substrate at least partially overlap with an orthographic of the drain on the substrate.

4. The thin film transistor according to claim 1, wherein:
the active layer is made of one or more of oxide, nitride, sulphide, oxynitride, sulphinitride which includes at least one element from indium, gallium, zinc, aluminum, and tin, and poly silicon.

5. The thin film transistor according to claim 1, wherein:
the gate, the source and the drain are made of at least one of Mo, MoNb alloy, Al, AlNd alloy, Ti and Cu.

6. The thin film transistor according to claim 2, wherein:
the source includes a ring-shaped source body and a source extension connecting with the ring-shaped source body;
the source contact through-hole in the first insulation layer is a ring-shaped opening, the ring-shaped opening is over the ring-shaped source body;
the active layer covers the first insulation layer over the ring-shaped source body;
the second insulation layer is over the active layer, the drain contact through-hole in the second insulation layer is a ring-shaped opening;
and
the gate includes an open-loop gate body and a gate extension connecting with the open-loop gate body, the open-loop gate body surrounds the source body, the open position of the open-loop gate body is corresponding to the position of the source extension.

7. An array substrate comprising at least one thin film transistor according to claim 1.

8. The array substrate according to claim 7, further including:
a passive layer formed over the drain of the thin film transistor, and the second insulation layer; and
a pixel electrode electrically connecting with the drain of the thin film transistor through a pixel contact through-hole in the passive layer over the passive layer.

9. The array substrate according to claim 8, further including
an auxiliary electrode electrically connecting with the gate of the thin film transistor through a gate contact through-hole in the passive layer over the passive layer; and
the pixel electrode and the auxiliary electrode are formed in a same layer.

10. The array substrate according to claim 9, wherein:
the orthographic projection of the gate contact-through hole on the substrate and the orthographic projection of the source contact through-hole on the substrate partially overlap.

11. The array substrate according to claim 10, wherein:
the passive layer is a multiple-layer structure made of two or more of $SiO_x$, $SiN_x$, $HfO_x$, SiON and $AlO_x$; and
the pixel electrode is a multiple-layer structure including a ITO/Ag/ITO structure, an Ag/ITO structure, an IZO/Ag/IZO structure, an Ag/IZO structure, an IGZO/Ag/IGZO structure, an InGaSnO/Ag/InGaSnO structure, an Ag/InGaSnO structure, or a structure made of one of ITO, ZnO, PEDOT:PSS, PANI, Cu, Au, Ag, and Pt.

12. A display apparatus comprising at least the array substrate according to claim 7.

13. A method for fabricating a thin film transistor, comprising:
forming a source on a substrate;
forming a first insulation layer having a source contact through-hole exposing the source over the substrate;
forming an active layer connecting with the source through the source contact through-hole over the first insulation layer;
forming a second insulation layer over the active layer and the first insulation layer, the second insulation layer having a drain contact through-hole exposing an upper surface of a portion of the active layer disposed outside the source contact through-hole; and
forming a drain electrically connecting with the active layer over the second insulation layer.

14. The method according to claim 13, further including:
forming a gate in a same layer one of the source and the drain.

15. The method according to claim 13, wherein forming the source further includes:
forming a first metal layer over the substrate; and
patterning the first metal layer.

16. The method according to claim 15, wherein:
the first metal layer is formed by one of a sputtering process, a thermal evaporation process, a plasma-enhanced chemical vapor deposition process, an atmospheric chemical vapor deposition process, and an electron cyclotron resonance chemical vapor deposition process; and
the first metal layer is a multiple-layer structure made of two or more of Mo, MoNb, Al, AlNd, Ti and Cu.

17. The method according to claim 13, wherein:
the active layer is formed by a magneto sputtering process; and
the active layer is made of one of InGaZnO, InSnO, InGaSnO, and doped poly silicon.

18. A method for fabricating an array substrate comprising the method for fabricating a thin film transistor according to claim 13.

19. The method according to claim 18, further including:
forming a passive layer having a pixel electrode contact through-hole exposing the drain of the thin film transistor over the drain of the thin film transistor and the second insulation layer; and
forming a pixel electrode electrically connecting with the drain of the thin film transistor through the pixel electrode contact through-hole over the passive layer.

20. The method according to claim 19, further including
forming a gate contact through-hole exposing the gate of the thin film transistor over the drain of the thin-film transistor, the gate of the thin film transistor and the passive layer when the pixel electrode is being formed; and
forming an auxiliary electrode electrically connecting with the gate through the gate contact through-hole when the pixel electrode is being formed.

* * * * *